(12) United States Patent
Poeppelman

(10) Patent No.: US 6,823,487 B1
(45) Date of Patent: Nov. 23, 2004

(54) METHOD AND APPARATUS FOR ENHANCING CORRECTION POWER OF REVERSE ORDER ERROR CORRECTION CODES

(75) Inventor: Alan D. Poeppelman, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 590 days.

(21) Appl. No.: 10/002,479

(22) Filed: Nov. 15, 2001

(51) Int. Cl.[7] .................. H03M 13/00; H03M 13/03
(52) U.S. Cl. .................. 714/785; 714/795; 714/796
(58) Field of Search .................. 714/785, 795, 714/796, 746, 752, 758, 763, 786, 800, 793, 791

(56) References Cited

U.S. PATENT DOCUMENTS 4,998,253 A * 3/1991 Ohashi et al. .............. 714/791
5,251,219 A * 10/1993 Babb .......................... 714/755
5,633,882 A * 5/1997 Babb et al. .................. 714/785
6,530,060 B1 * 3/2003 Vis et al. ..................... 714/792

* cited by examiner

*Primary Examiner*—Christine T. Tu
(74) *Attorney, Agent, or Firm*—Yee & Associates

(57) ABSTRACT

An improved error correction code process takes advantage of information available from a post processor. This information is a list of highly probable error event patterns and locations found by employing a list Viterbi or a set of matched filters on Viterbi data. This list of possible errors can be used by the error correction code decoder in an iterative process whenever the correction power of the error correction code decoder is exceeded. If the error correction code decoder cannot correct the data on its first unassisted try, an iterative process is employed which, in essence, modifies the data with potential errors identified from the list created by the post processor and tries the correction process over again. An algorithm may be employed to try each error singly or in combination with other errors. This iterative process continues until a correctable indication is given by the error correction code decoder algorithm. The data is then corrected with the error correction code decoder results and the corresponding error list.

20 Claims, 5 Drawing Sheets

METHOD AND APPARATUS FOR ENHANCING CORRECTION POWER OF REVERSE ORDER ERROR CORRECTION CODES

BACKGROUND OF THE INVENTION

1. Technical Field

The present invention is directed generally toward a method and apparatus for enhancing the correction power of reverse order error correction codes.

2. Description of the Related Art

Read channel integrated circuits for magnetic storage often contain significant digital signal processing and error correction logic to reliably reconstruct the original data stored on the media. Simplified block diagrams for this signal processing and error correction functions are given in FIGS. 1A and 1B for a typical implementation of the encode and decode side of the process. Particularly, FIG. 1A illustrates a typical implementation of an encode process. Data is received by error correction code (ECC) encoder 105. ECC encoder 105 generates check bits, which are typically concatenated to the end the sector. Thus, a predetermined number of bits of error correction code are computed for every unit of data being stored. When data is retrieved, the ECC syndromes are computed to determine if any of the data bits have been corrupted. Traditionally, the ECC encoder resides in the data controller chip.

Constraint encoder 110 receives the ECC encoded data from the ECC encoder. Constraint encoding is an encoding method commonly used on magnetic disks. A run length limited (RLL) encoder is an example of a constraint encoder. The actual number of bits recorded on the disk is greater than the data bits. The data is encoded to limit the length of certain patterns in the data for timing recovery and/or error suppression reasons. As electronics improve, fewer extra bits are inserted, and the ratio of data bits to recorded bits becomes greater. The "run length" is the number of consecutive zeros before a one bit is recorded. For example, RLL 1,7 means there must be at least one zero bit between every one bit, and the 7 means a maximum of eight time periods between flux transitions. Constraint 110 and the remainder of the encode process typically resides in the read channel chip. The constraint encoded data is received by post processing encoder 115, which further encodes data for write logic and driver 120. The write logic and driver outputs analog data to the storage device.

Turning to FIG. 1B, a typical decode process is depicted. Analog front end (AFE) 150 receives analog data in from a storage device and analog-to-digital converter (ADC) 155 converts the data to digital. Finite impulse response (FIR) 160 filters the data. Viterbi detector 165 is a maximum likelihood detector that computes the most likely data sequence. Post processor 170 performs processing on the Viterbi data. Constraint decoder 175 removes the constraint code. These elements of the decode process traditionally reside in the read channel chip. ECC decoder 180 decodes the error correction code and outputs corrected data. The ECC decoder traditionally resides in the data controller chip.

Analog Front End accepts analog signals from the pre-amp and filters it before the ADC digitizes it. The FIR (Finite Impulse Response) Filter conditions the digitized signal by digitally filtering it and attempts to match a "target".

As silicon processing improved over time allowing increased integration of functions on the same chip and as the error propagation properties of the constraint decoder have worsened, the idea of reverse order ECC has emerged. The basic idea of reverse order ECC, sometimes called reverse ECC, is to switch the order of the constraint and ECC encoding/decoding. Switching the order of the constraint decoder and the ECC decoder allows the full strength of the ECC to be utilized without the diluting effect of the constraint decoder's error multiplication properties. This change in structure for reverse ECC is shown in FIGS. 2A and 2B.

Particularly, FIG. 2A illustrates a typical reverse ECC encode process. In the encode process of FIG. 2A, constraint encoder 205 and ECC encoder 210 are reversed. The ECC bits which are typically concatenated at the end of the data sector, may not conform to the constraint requirements and may need to pass through a separate and different constraint encoder. Post processing encoder 215 may not be beneficial and may be removed from the process. Turning to FIG. 2B, a typical reverse ECC decode process is depicted. In the decode process of FIG. 2B, ECC decoder 275 and constraint decoder 280 are reversed. Thus, the full strength of ECC decoder 275 may be realized without errors being multiplied by constraint decoder 280.

A Viterbi detector finds the most likely binary sequence given a stream of digitized data in a least mean square error sense. A Viterbi detector is used when inter-symbol interference is involved in the signal, that is, when signals overlap each other.

If the encoding of a constraint code spans over multiple ECC symbols, error propagation can occur. This is because an error might be limited to a short span before constraint code decoding but fans out to additional bits when decoded. An increase in errors, due to errors being multiplied by a constraint decoder, results in a higher sector retry/failure rate. A retry due to uncorrectable data is time consuming. Therefore, it would be advantageous to provide improved correction power for ECC decoding during a reverse ECC decode process to avoid an increase in the number of repeated retrievals due to uncorrectable data.

SUMMARY OF THE INVENTION

The present invention takes advantage of information available from a post processor. This information is a list of highly probable error event patterns and locations found by employing a list Viterbi or a set of matched filters on Viterbi data This list of possible errors can be used by the ECC decoder in an iterative process whenever the correction power of the ECC is exceeded. If the ECC decoder cannot correct the data on its first unassisted try, an iterative process is employed which, in essence, modifies the data with potential errors identified from the list created by the post processor and tries the correction process over again. An algorithm may be employed to try each error singly or in combination with other errors. This iterative process continues until a correctable indication is given by the ECC algorithm. The data is then corrected with the ECC results and the corresponding error list.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION

The description of the preferred embodiment of the present invention has been presented for purposes of illustration and description, but is not limited to be exhaustive or limited to the invention in the form disclosed. Many modifications and variations will be apparent to those of ordinary skill in the art. The embodiment was chosen and described in order to best explain the principles of the invention the practical application to enable others of ordinary skill in the art to understand the invention for various embodiments with various modifications as are suited to the particular use contemplated.

Figure 1A:
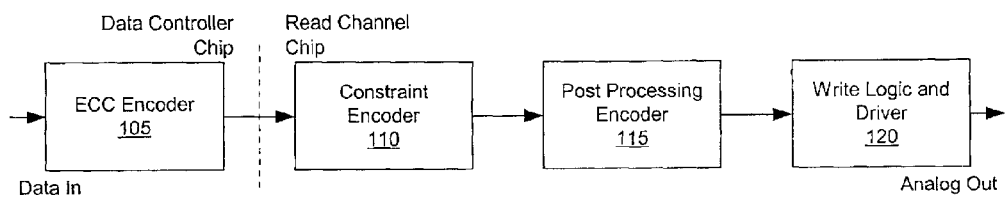
FIGS. 1A and 1B depict a prior art implementation of encode and decode processes.
Figure 1B:
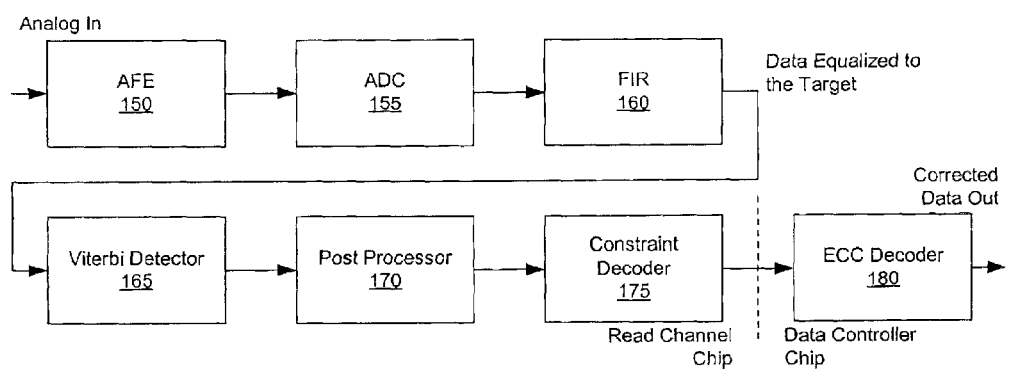
Figure 2A:
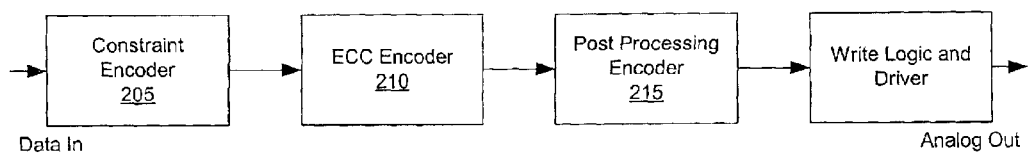
FIGS. 2A and 2B illustrate prior art reverse ECC encode and decode processes.
Figure 2B:
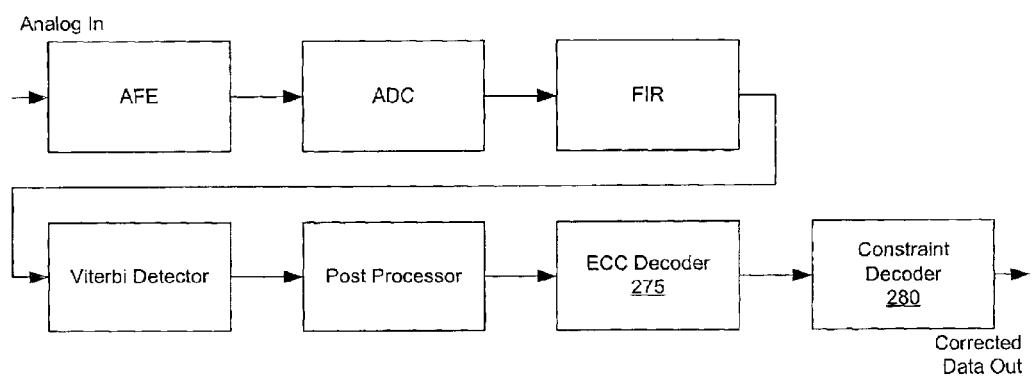
Figure 3:
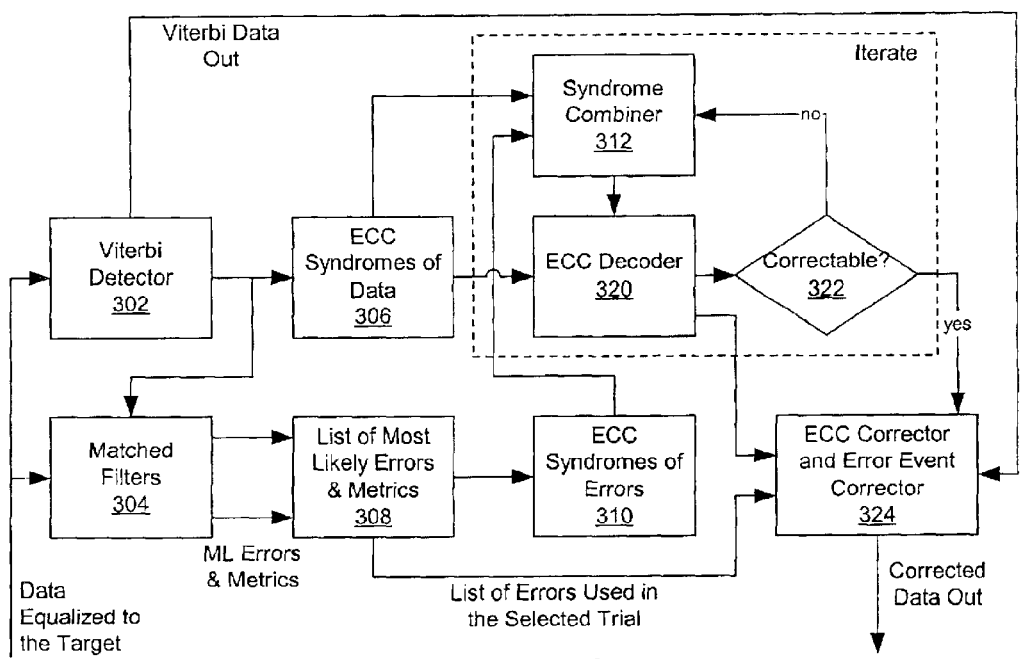
FIG. 3 is an iterative ECC decode process in accordance with a preferred embodiment of the present invention.

With reference now to the figures and in particular with reference to FIG. 3, an iterative ECC decode process is shown in accordance with a preferred embodiment of the present invention. Data equalized to the target is received by Viterbi detector 302 and matched filters The Viterbi detector provides data to ECC syndrome generator 306. ECC decoder 320 attempts to correct the data given the ECC syndromes of data. If the data is correctable 322, ECC corrector and error event corrector 324 produces corrected data out. The Viterbi detector produces "ones and zeros" from the digitized data stream output of the FIR. The ECC decoder provides a list of locations and bits to toggle to the ECC corrector and event corrector.

One enhancement to the invention is to calculate the ECC syndromes for each error event supplied by the post processor and for the raw data itself. By making use of the linear property of ECC codes, the ECC syndrome for iterative trials may be created simply by performing an exclusive-OR (XOR) on the ECC syndromes of data with all the ECC syndromes of errors used in the trial. This saves the computational effort of recalculating the ECC syndromes for each trial by the polynomial division method.

Thus, matched filters 304 produce a list of most likely errors and metrics 308 given the data equalized to the target and the ECC syndromes of data. The list of most likely errors and metrics produces ECC syndromes of errors 310. Syndrome combiner 312 combines the ECC syndromes of data and the ECC syndromes of errors. The ECC decoder may then try combinations of syndromes until a correctable indication is given in 322.

Each trial would XOR the data syndromes with the corresponding error syndromes. If the trial was for error number 1 and 3 on the list, the 3 sets of syndromes would be XORed together data, error 1, and error 3. The ECC decoder algorithm has a predetermined number of ECC symbols it can correct. A symbol typically is 8 or 10 bits. The combiner combines syndromes until a correctable result is achieved or until all trials are exhausted. If a correction location is beyond the end of the sector or if there are fewer roots found to the "error locator polynomial" than the degree of the polynomial, then the data is uncorrectable. The corrected data out is passed to the constraint decoder.

Figure 4:
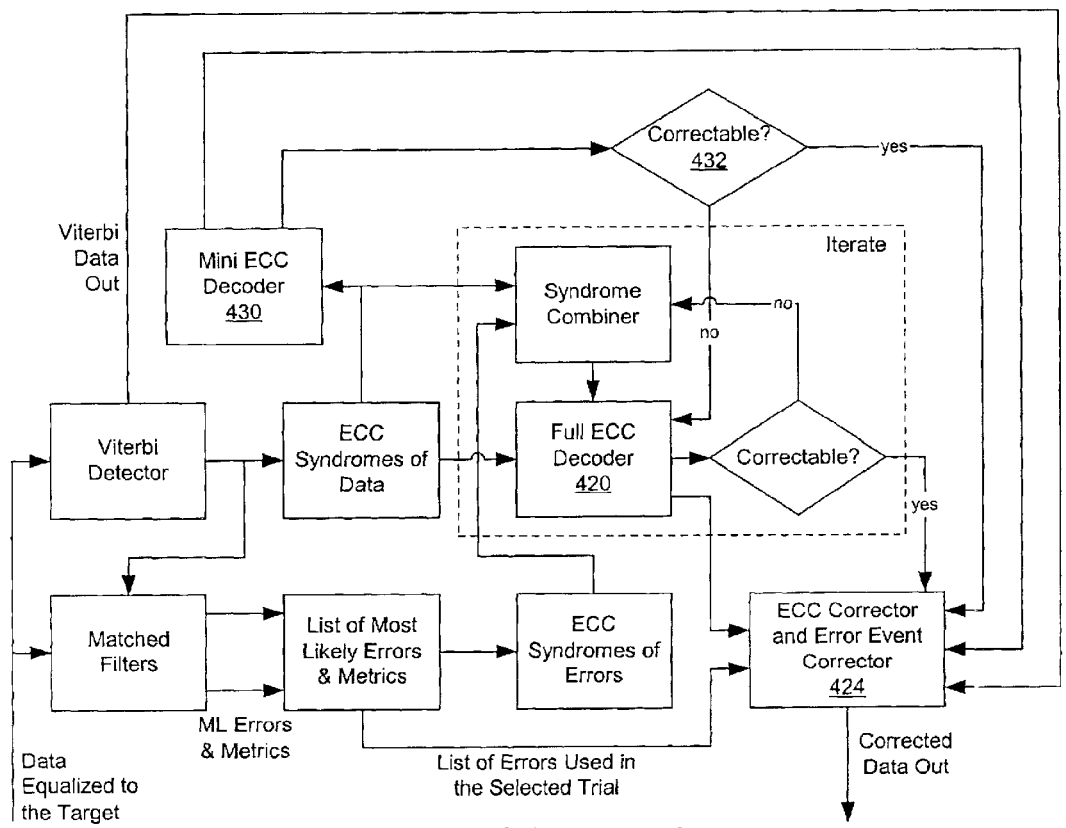
FIG. 4 is an iterative ECC decode process employing a small ECC decoder in accordance with a preferred embodiment of the present invention.

With reference now to FIG. 4, an iterative ECC decode process employing a small ECC decoder is shown in accordance with a preferred embodiment of the present invention. The process of FIG. 4 is similar to the process of FIG. 3. Mini ECC decoder 430 is employed to correct sectors with only a few errors, which occur frequently. Mini ECC decoder 430 receives ECC syndromes of data and the ECC algorithm determines whether the data is correctable 432. If the data is correctable in 432, ECC corrector and error event corrector 424 produces corrected data out.

If, however, the data is not correctable in 432, full ECC decoder 420 corrects the sectors with more errors, which occur much less frequently. The full ECC decoder could operate in either the single unassisted mode or in the assisted iterative mode. The mini ECC decoder would use a subset of the partial syndromes generated for the full ECC decoder so no additional redundancy bits are required. The mini ECC decoder would defer to the full ECC whenever an uncorrectable condition is flagged by the mini ECC correction algorithm.

Figure 5:
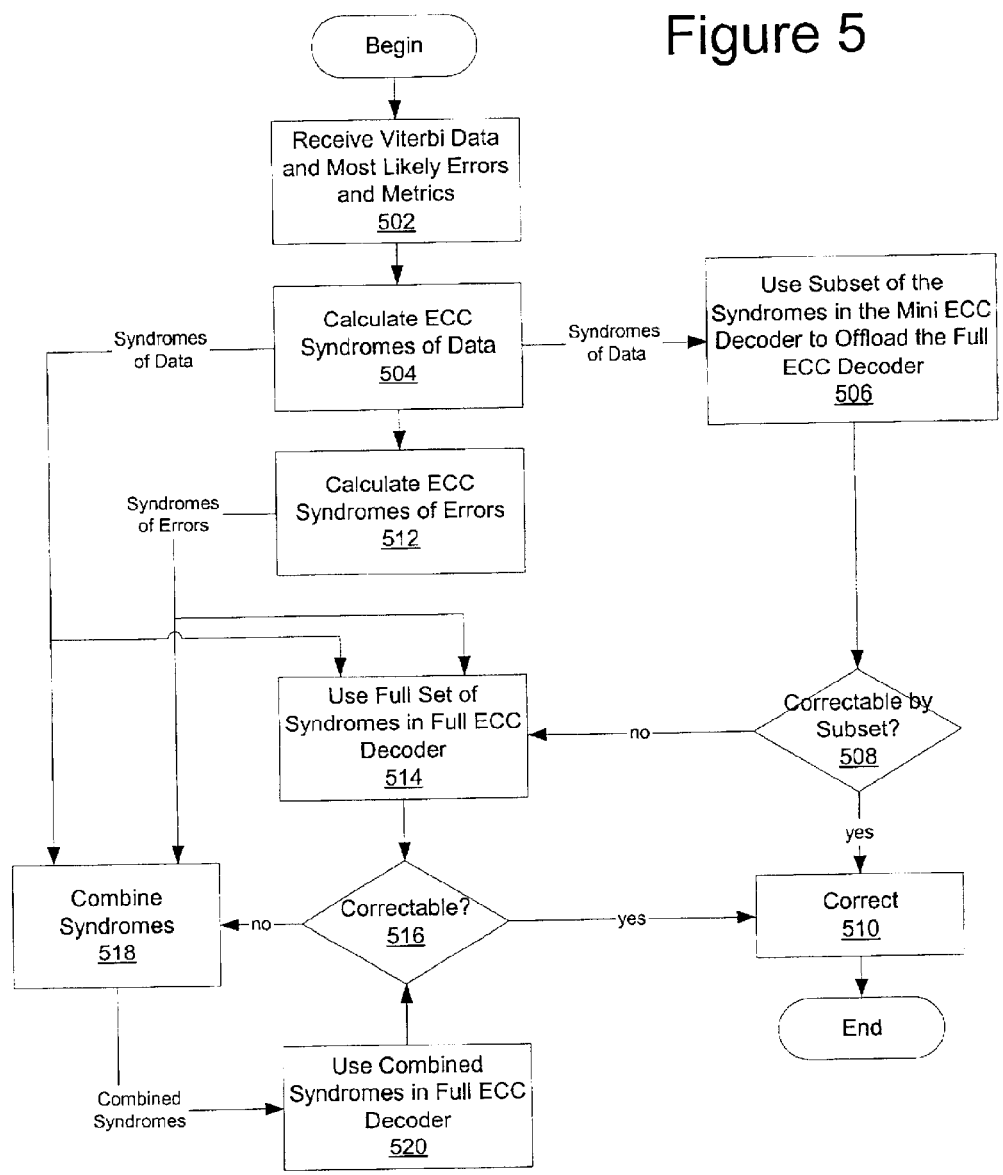
FIG. 5 is a flowchart of the operation of the ECC decoder process in accordance with a preferred embodiment of the present invention.

With reference to FIG. 5, a flowchart of the operation of the ECC decoder process is shown in accordance with a preferred embodiment of the present invention. The process begins and receives Viterbi data and most likely errors and metrics (step 502). The process then calculates ECC syndromes of data (step 504) and a subset of the partial syndromes is used by the mini ECC to offload the fill ECC (step 506). Next, a determination is made as to whether the data is correctable by the mini-ECC (step 508). If correctable by the mini-ECC, the data is corrected (step 510) and the process ends.

The process also calculates ECC syndromes of errors (step 512). If the data is not correctable in step 508, the full set of syndromes is used by the full ECC decoder (step 514) and a determination is made as to whether the data is correctable (step 516). If the data is not correctable, the process combines syndromes (step 518) and the combined syndromes are used in the full ECC decoder (step 520). Then, the process returns to step 516 to determine whether the data is correctable. If the data is correctable in step 516, the process proceeds to step 510 to correct the data. Thereafter, the process ends.

Thus, the present invention solves the disadvantages of the prior art by providing an ECC decoder algorithm that takes advantage of information available from a post processor. This information is a list of highly probable error event patterns and locations found by employing a list Viterbi or a set of matched filters on Viterbi data. This list of possible errors can be used by the ECC decoder in an iterative process whenever the correction power of the ECC is exceeded. If the ECC decoder cannot correct the data on its first unassisted try, an iterative process is employed which, in essence, modifies the data with potential errors identified from the list created by the post processor and tries the correction process over again. An algorithm may be employed to try each error singly or in combination with other errors. This iterative process continues until a correctable indication is given by the ECC algorithm. The data is then corrected with the ECC results and the corresponding error list. The invention has the advantage of higher ECC correction power without the corresponding increase in redundancy bits. This allows for higher data coding efficiency on the media. Conversely, the invention allows for a lower sector retry/failure rate due to the increase in correction power and lower uncorrectable sector rate.

What is claimed is:

1. A method for reverse order error correction codes comprising:
   a) receiving data;
   b) calculating error correction code syndromes of data;
   c) calculating error correction code syndromes of errors;
   d) combining error correction code syndromes of data with error correction code syndromes of errors to form combined syndromes;
   e) determining whether the data is correctable based on the combined syndromes;
   f) correcting the data if the data is correctable.

2. The method of claim 1, further comprising:
   repeating steps (d) and (e) until the data is correctable.

3. The method of claim 1, wherein the step of combining error correction code syndromes of data with error correction code syndromes of errors comprises performing an exclusive OR function.

4. The method of claim 1, wherein the step of combining error correction code syndromes of data with error correction code syndromes of errors comprises combining syndromes for data, a first error, and a second error.

5. The method of claim 1, further comprising:
   determining whether the data is correctable based on the syndromes of data; and
   calculating the error correction code syndromes of errors if the data is not correctable based on the syndromes of data.

6. The method of claim 5, further comprising:
   using a subset of partial syndromes in a mini decoder if the data is correctable based on the syndromes of data.

7. The method of claim 1, further comprising:
   providing the corrected data to a constraint decoder.

8. An apparatus for reverse order error correction codes comprising:
   an error correction code syndromes of data generator that generates error correction code syndromes of data for received data;
   an error correction code syndromes of errors generator that generates error correction code syndromes of errors for the received data;
   a syndrome combiner, wherein the syndrome combiner combines error correction code syndromes of data with error correction code syndromes of errors to form combined syndromes; and
   an error event corrector that corrects the received data based on the combined syndromes.

9. The apparatus of claim 8, further comprising:
   a Viterbi detector that provides Viterbi data,
   wherein the error correction code syndromes of data generator generates the error correction code syndromes of data based on the Viterbi data.

10. The apparatus of claim 9, further comprising:
    matched filters that generate a list of most likely errors and metrics based on the Viterbi data,
    wherein the error correction code syndromes of errors generator generates the error correction code syndromes of errors based on the list of most likely errors and metrics.

11. The apparatus of claim 8, wherein the syndrome combiner combines error correction code syndromes of data with error correction code syndromes until the data is correctable.

12. The apparatus of claim 8, wherein the syndrome combiner comprises an exclusive OR function.

13. The apparatus of claim 8, wherein the syndrome combiner combines syndromes for data, a first error, and a second error.

14. The apparatus of claim 8, further comprising:
    a fill error correction code decoder that determines whether the received data is correctable based on the combined syndromes.

15. The apparatus of claim 14, wherein the error event corrector corrects the received data in response to the full error correction code decoder determining that the received data is correctable based on the combined syndromes.

16. The apparatus of claim 14, further comprising:
    a mini error correction code decoder that determines whether the received data is correctable based on the error correction code syndromes of data,
    wherein the error event corrector corrects the received data in response to the mini error correction code decoder determining that the received data is correctable based on the error correction code syndromes of data.

17. The apparatus of claim 8, further comprising:
    a constraint decoder for constraint decoding the corrected data.

18. A computer program product, in a computer readable medium, for reverse order error correction codes comprising:
    first instructions for receiving data;
    second instructions for calculating error correction code syndromes of data;
    third instructions for calculating error correction code syndromes of errors;
    fourth instructions for combining error correction code syndromes of data with error correction code syndromes of errors to form combined syndromes;
    fifth instructions for determining whether the data is correctable based on the combined syndromes; and
    sixth instructions for correcting the data if the data is correctable.

19. The computer program product of claim 18, wherein the fourth an fifth instructions are repeated until the data is correctable.

20. The computer program product of claim 18, further comprising:
    seventh instructions for providing the corrected data to a constraint decoder.

* * * * *